US006533402B2

United States Patent
Miyata (10) Patent No.: US 6,533,402 B2
(45) Date of Patent: Mar. 18, 2003

(54) INK-JET RECORDING HEAD, METHOD OF MANUFACTURING THE SAME, AND INK-JET RECORDING APPARATUS

(75) Inventor: Yoshinao Miyata, Nagano-ken (JP)

(73) Assignee: Seiko Epson Corporation, Tokyo (JP)

( * ) Notice: Subject to any disclaimer, the term of this patent is extended or adjusted under 35 U.S.C. 154(b) by 62 days.

(21) Appl. No.: 09/815,289

(22) Filed: Mar. 23, 2001

(65) Prior Publication Data

US 2002/0012029 A1 Jan. 31, 2002

(30) Foreign Application Priority Data

Mar. 24, 2000 (JP) ..................................... 2000-084772
Sep. 14, 2000 (JP) ..................................... 2000-279400
Feb. 28, 2001 (JP) ..................................... 2001-054074

(51) Int. Cl.$^7$ ............................................... B41J 2/045
(52) U.S. Cl. ....................................................... 347/68
(58) Field of Search ............................. 374/68, 69, 70, 374/71, 72, 54, 20; 29/890.1

(56) References Cited

U.S. PATENT DOCUMENTS 6,074,036 A * 6/2000 Nishioka et al. ............... 347/20
6,109,736 A * 8/2000 Miyata et al. ................ 347/68
6,190,003 B1 * 2/2001 Sato et al. ...................... 347/54

FOREIGN PATENT DOCUMENTS

EP 0 863 007 A2 9/1998 ............... B41J/2/14
EP 0 863 007 A3 7/1999 ............... B41J/2/14
JP 5-286131 11/1993 ............ B41J/2/045

OTHER PUBLICATIONS

Abstract. JP 5–286131. Nov. 2, 1993.

* cited by examiner

Primary Examiner—Anh T. N. Vo
(74) Attorney, Agent, or Firm—Sughrue Mion, PLLC

(57) ABSTRACT

Disclosed are an ink-jet recording head, a method of manufacturing the ink-jet recording head, and an ink-jet recording apparatus, which prevents operational malfunctions owing to external environments, such as humidity, around a piezoelectric element. An ink-jet recording head which includes a passage-forming substrate in which a pressure generating chamber communicating with a nozzle orifice is partitioned by a plurality of compartment walls, and a piezoelectric element provided on one plane side of the passage-forming substrate and causing a change in pressure in the pressure generating chamber, the ink-jet recording head includes a joint member jointed to a piezoelectric element side of said passage-forming substrate, the joint member having piezoelectric element holding portion securing a space having a volume so as not to disturb movement of said piezoelectric element and at least one communication hole allowing the piezoelectric element holding portion to communicate with the outside, wherein the piezoelectric element holding portion is surely sealed by filling a sealing member made of resin in the communication hole.

17 Claims, 9 Drawing Sheets

INK-JET RECORDING HEAD, METHOD OF MANUFACTURING THE SAME, AND INK-JET RECORDING APPARATUS

BACKGROUND OF THE INVENTION

The present invention relates to an ink-jet recording head, in which a portion of a pressure generating chamber communicating with a nozzle orifice that ejects ink droplets is constituted of a vibration plate, a piezoelectric element is provided via this vibration plate, and ink droplets are ejected by displacement of the piezoelectric element. Furthermore, the present invention relates to a manufacturing method of the same and an ink-jet recording apparatus.

As an ink-jet recording head having a structure that a part of a pressure generating chamber communicating with a nozzle orifice for ejecting ink droplets is constructed by a vibration plate, and a piezoelectric element allows the vibration plate to be deformed to pressurize ink in the pressure generating chamber, thus ejecting ink droplets from the nozzle orifice, two sorts of the ink-jet recording heads have been put into practical use. Specifically, one uses a piezoelectric actuator in a longitudinal vibration mode in which the actuator stretches and contracts in the axial direction of the piezoelectric element, and the other uses a piezoelectric element in a flexural vibration mode.

While the former is capable of changing the volume of the pressure generating chamber by allowing an end face of the piezoelectric element to thrust the vibration plate and manufacturing a head suitable for high density printing, the former has been involved in a problem that a troublesome step for cutting the piezoelectric element to be comb-tooth shaped so as to be coincident with an arrangement pitch of the nozzle orifice must be performed as well as an operation to position the cut piezoelectric element in the pressure generating chamber and fix it thereto, thus making manufacturing steps complicated.

On the other hand, while the latter can fix the piezoelectric element to the vibration plate with a relatively simple step for adhering a green sheet of piezoelectric material to the vibration plate so as to fit it to the shape of the pressure generating chamber and sintering them. However, a certain size of vibration plate is required due to the usage of flexural vibration, thus there is a problem that high density array of the piezoelectric elements is difficult.

On the other hand, to solve the disadvantages of the recording head of the latter, as disclosed in Japanese Patent Laid-Open No. 50-286131, a recording head is proposed, in which a piezoelectric material layer having an even thickness is formed over the entire surface of a vibration plate by a film growth method, and this piezoelectric material layer is cut by a lithography method so that each piece of the layer fits to the shape of respective pressure generating chambers, thus forming piezoelectric elements independently for the respective pressure generating chambers.

According to this recording head, the operation to adhere the piezoelectric element to the vibration plate is unnecessary, and hence not only the piezoelectric element can be fixed to the vibration plate by the lithography method that is precise and simple, but also the thickness of the piezoelectric element can be made small, thus enabling a high speed drive.

However, in the case where the piezoelectric element is formed by sputtering the piezoelectric material, when the piezoelectric element is driven at a voltage approximately equal to that for driving one formed by sintering the green sheet, a higher electric field is applied thereto as the thickness of the piezoelectric element becomes smaller. When the piezoelectric element absorbs humidity in the air, the leak current between driving electrodes is apt to increase, leading to a dielectric breakdown.

SUMMARY OF THE INVENTION

The present invention was invented from the viewpoint of the foregoing circumstances, and the object of the present invention is to provide an ink-jet recording head which prevents operational malfunction of the piezoelectric element due to external environments around such as humidity, a method of manufacturing the same, and an ink-jet recording apparatus.

A first aspect of the present invention is an ink-jet recording head which comprises a passage-forming substrate in which a pressure generating chamber communicating with a nozzle orifice is partitioned by a plurality of compartment walls, and a piezoelectric element provided on one plane side of the passage-forming substrate and causing a change in pressure in the pressure generating chamber. The ink-jet recording head comprising: a joint member jointed to a piezoelectric element side of said passage-forming substrate, said joint member having piezoelectric element holding portion securing a space having a volume so as not to disturb movement of said piezoelectric element and at least one communication hole allowing said piezoelectric element holding portion to communicate with the outside, wherein a sealing member made of resin is filled in said communication hole, so that said piezoelectric element holding portion is hermetically sealing.

In the first aspect of the present invention, the piezoelectric element can be hermetically sealed in the piezoelectric element holding portion relatively easily, and the ink-jet recording head can be realized, which is capable of preventing operational malfunctions of the piezoelectric element owing to external environments.

A second aspect of the present invention according to the first aspect is the ink-jet recording head in which the piezoelectric element holding portion is sealed under air pressure lower than atmospheric pressure.

In the second aspect of the present invention, since the sealing member for sealing the communication hole is partially pulled into the communication hole, the piezoelectric element holding portion can be hermetically sealed more surely.

A third aspect of the present invention according to the second aspect is the ink-jet recording head in which a part of the communication hole is constituted by a groove portion formed on a joint plane of the joint member and the passage-forming substrate.

In the third aspect of the present invention, by adjusting the shape and length of the groove portion, a quantity of the sealing member pulled into the communication hole is controlled.

A fourth aspect of the present invention according to any one of the first to third aspects is the ink-jet recording head in which a total length x of the communication hole is a length satisfying the relation expressed by the following equation (1) represented by a flow path resistance R per a unit length of the communication hole, an injection pressure P when the sealing member is injected into the communication hole, an orifice area S of the communication hole and a time t for which the sealing member is cured.

$$x > \frac{\sqrt{2 \times P \times t}}{\sqrt{R \times S}} \quad (1)$$

In the fourth aspect of the present invention, since the length of the communication hole can be made relatively short so that the sealing member does not enter the piezoelectric element holding portion, an area of the joint member can be controlled to be small, and cost can be reduced.

A fifth aspect of the present invention according to any one of the first to fourth aspects is the ink-jet recording head having a resistance portion in a part of the communication hole in the length direction thereof, the resistance portion showing a flow path resistance higher than that of other portions of the communication hole.

In the fifth aspect of the present invention, the resistance portion can surely prevent the sealing member from entering the piezoelectric element holding portion.

A sixth aspect of the present invention according to the fifth aspect is the ink-jet recording head in which the resistance portion of the communication hole has a narrower cross section than those of other portions of the communication hole.

In the sixth aspect of the present invention, by setting the cross section of the resistance portion to be narrower than those of other portions of the communication hole, the flow path resistance of the resistance portion can be made larger than those of other portions of the communication hole relatively easily.

A seventh aspect of the present invention according to any one of the fifth and sixth aspects is the ink-jet recording head in which the resistance portion is provided at a position of the communication hole which the sealing member enters.

In the seventh aspect of the present invention, it is possible to surely prevent the sealing member from entering the piezoelectric element holding portion.

An eighth aspect of the present invention according to any one of the third to seventh aspects is the ink-jet recording head in which the communication hole meanders on a joint plane in a direction to connect the piezoelectric element holding portion and the communication hole for allowing the piezoelectric element holding portion to communicate with the outside.

In the eighth aspect of the present invention, the communication hole having a desired length can be formed in a relatively narrow area.

A ninth aspect of the present invention according to any one of the first to eighth aspects is the ink-jet recording head in which dry fluid is filled in the piezoelectric element holding portion.

In the ninth aspect of the present invention, since the piezoelectric element is held in a dry fluid atmosphere, operational malfunctions of the piezoelectric element owing to external environments can be surely prevented.

A tenth aspect of the present invention according to the ninth aspect is the ink-jet recording head in which the dry fluid is inert gas.

In the tenth aspect of the present invention, the piezoelectric element is held in an atmosphere of the inert gas and isolated from external environments.

An eleventh aspect of the present invention according to the ninth aspect is the ink-jet recording head in which the dry fluid contains oxidized gas.

In the eleventh aspect of the present invention, deterioration of a piezoelectric layer principally made of oxide can be prevented.

A twelfth aspect of the present invention according to any one of the first to eleventh aspects is the ink-jet recording head in which a driving IC for driving the piezoelectric element is loaded on the joint member, and a protection member made of resin provided so as to cover the driving IC also performs a role as the sealing member.

In the twelfth aspect of the present invention, since the protection member also performs the role as the sealing member, manufacturing cost can be reduced.

A thirteenth aspect of the present invention according any one of the first to twelfth aspects is the ink-jet recording head in which the pressure generating chamber is formed in the single crystal silicon substrate by anisotropic etching, and each layer forming the piezoelectric element is formed by a film growth method and a lithography method.

In the thirteenth aspect of the present invention, the ink-jet recording head in which a nozzle orifice is provided with a high density can be mass-produced relatively easily.

A fourteenth aspect of the present invention is an ink-jet recording apparatus which comprises the ink-jet recording head according to any one of the first to thirteenth aspects.

In the fourteenth aspect of the present invention, the ink-jet recording apparatus, improving reliability of the head can be achieved.

A fifteenth aspect of the present invention is a method of manufacturing an ink-jet recording head which comprises: a passage-forming substrate in which a pressure generating chamber communicating with a nozzle orifice is partitioned by a plurality of compartment walls; and a piezoelectric element provided on one plane side of the passage-forming substrate and causing a change in pressure in the pressure generating chamber. The method comprises: a first step for adhering a piezoelectric side of said passage-forming substrate and joint member to each other, so that a joint body is formed; said joint member having a piezoelectric element holding portion securing a space having a volume on the piezoelectric element side of said passage-forming substrate so as not to disturb the motion of the piezoelectric element and a communicating hole allowing the piezoelectric element holding portion to communicate with the outside; a second step for dropping uncured resin at least onto the communication hole of the joint member constituting the joint body; a third step for disposing the joint body in a predetermined sealed space and decompressing the sealed space; and a fourth step for restoring the sealed space to a normal pressure and curing the uncured resin.

In the fifteenth aspect of the present invention, the communication hole can be sealed by the resin relatively easily and surely, and the piezoelectric element holding portion can surely be hermeticall sealed.

A sixteenth aspect of the present invention according to the fifteenth aspect is the method of manufacturing an ink-jet recording head, the method further comprising: a step for replacing the air in the piezoelectric element holding portion with dry fluid prior to the second step.

In the sixteenth aspect of the present invention, since the dry fluid is filled in the piezoelectric element holding portion, the piezoelectric element is held in the dry fluid atmosphere, and operational malfunctions of the piezoelectric element owing to external environments can be prevented.

A seventeenth aspect of the present invention according to the sixteenth aspect is the method of manufacturing an ink-jet recording head, wherein the replacing step includes a step for disposing the joint body in a predetermined sealed space filled with the dry fluid and decompressing the sealed space, and a step for introducing the dry fluid into the sealed space and restoring the sealed space to a normal pressure.

In the seventeenth aspect of the present invention, the dry fluid can be filled in the piezoelectric element holding portion relatively easily and surely.

An eighteenth aspect of the present invention according to any one of the fifteenth to seventeenth aspects is the method of manufacturing an ink-jet recording head, wherein, in the second step, the uncured resin is provided so as to cover the drive circuit for driving the piezoelectric element provided on the joint member.

In the eighteenth aspect of the present invention, the piezoelectric element holding portion can be sealed by resin, and the drive circuit can be protected. In addition, the manufacturing steps can be simplified.

BRIEF DESCRIPTION OF THE DRAWINGS

For a more complete understanding of the present invention and the advantages thereof, reference is now made to the following descriptions taken in conjunction with the accompanying drawings.

FIGS. 4(a) and (b) are section views showing manufacturing steps of the ink-jet recording head according to the first embodiment of the present invention FIGS. 5(a) and (b) are section views showing manufacturing steps of the ink-jet recording head according to the first embodiment of the present invention.

DETAILED DESCRIPTION OF THE PREFERRED EMBODIMENTS

The present invention will be described in detail based on the embodiments below.

Embodiment 1

Figure 1:
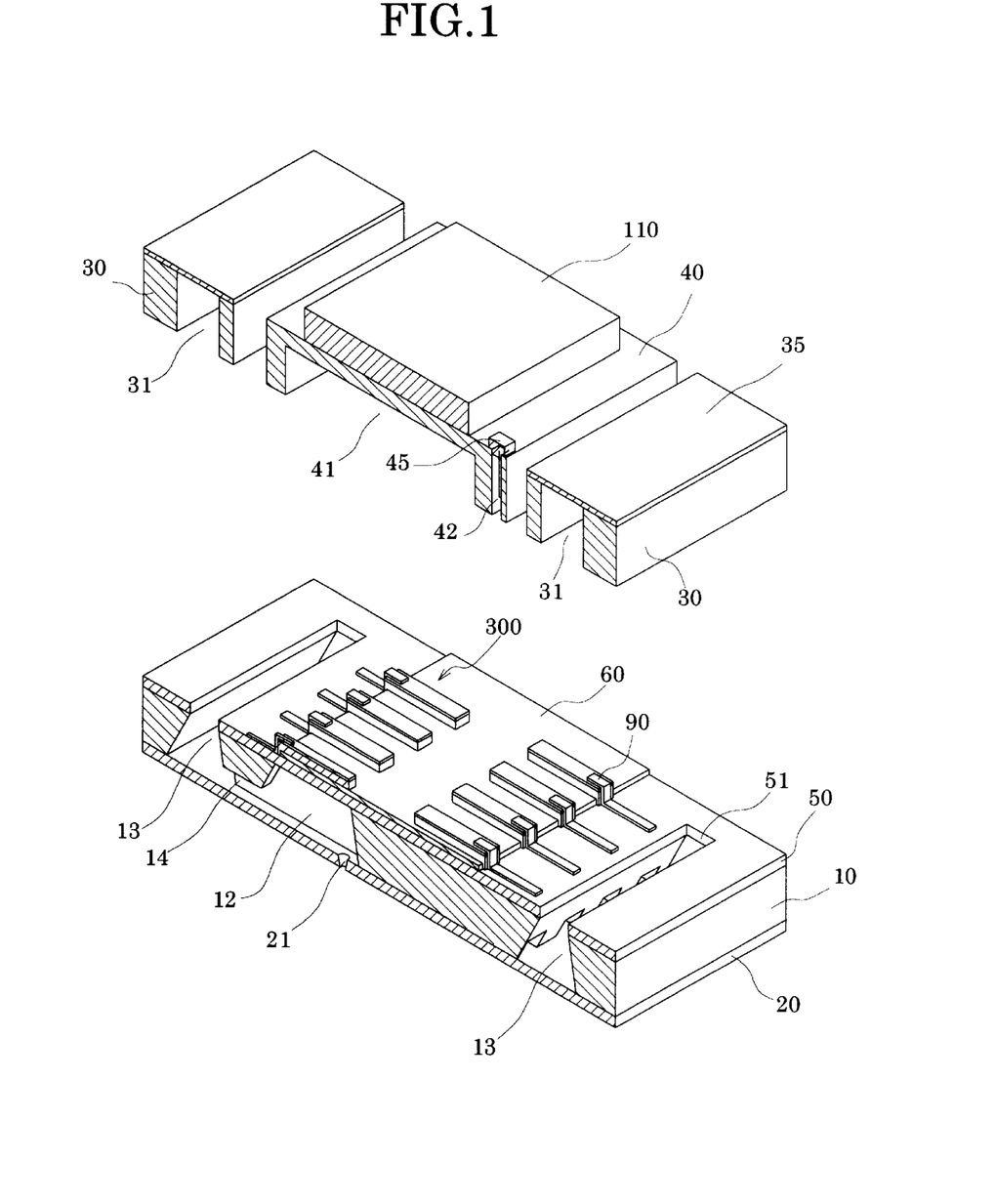
FIG. 1 is a perspective view showing an outline of an ink-jet recording head according to the first embodiment of the present invention.

FIG. 1 is an exploded perspective view showing an ink-jet recording head according to the first embodiment of the present invention, and FIGS. 2(a) and 2(b) are a plan view of FIG. 1 and a section view of FIG. 1, respectively.

As shown in FIGS. 1, 2(a) and 2(b), in this embodiment a passage-forming substrate 10 is made of a (110) surface orientation single crystal silicon substrate. As the passage-forming substrate 10, one having a thickness of about 150 $\mu$m to 300 $\mu$m is normally used, preferably about 180 $\mu$m to 280 $\mu$m, and more preferably about 220 $\mu$m. This is because the arrangement density of the pressure generating chambers can be made high while keeping rigidity of the compartment wall between adjacent pressure generating chambers.

One plane of the passage-forming substrate 10 is an opening plane, and an elastic film 50 having a thickness of 1 $\mu$m to 2 $\mu$m, made of silicon dioxide previously formed by thermal oxidation, is formed on the other plane thereof.

On the other hand, pressure generating chambers 12 partitioned by a plurality of compartment walls 11 are provided in a width direction of the pressure generating chamber 12 by performing anisotropic etching for the single crystal silicon substrate. A communication portion 13 constituting a part of reservoir 100 serving as an ink chamber shared by the pressure generating chambers 12, which communicates with a reservoir portion of a reservoir forming plate described later, is formed on the external side of the pressure generating chamber 12 in the longitudinal direction thereof. The communication portion 13 communicates with one end of each pressure generating chamber 12 in the longitudinal direction thereof through an ink supply path 14. Note that the ink supply path 14 is also partitioned by the compartment wall 11, similar to the pressure generating chambers 12.

Here, the anisotropic etching is carried out by use of its property that a single crystal silicon substrate is gradually eroded by immersing the single crystal silicon substrate in an alkali solution such as KOH, so as to expose a first (111) plane perpendicular to a (110) plane and a second (111) plane forming an angle of about 70 degrees to the first (111) plane and an angle of about 35 degrees to the (110) plane, and the etching rate of the (111) plane is about 1/180 that of the (110) plane. With such an anisotropic etching, it is possible to perform a precision processing based on depth processing having a parallelogram-shape formed by the two first (111) planes and the slanted two second (111) planes, so that the pressure generating chambers 12 are arranged with high density.

In this embodiment, the long side of each of the pressure generating chambers 12 is formed by the first (111) plane and the short side thereof is formed by the second (111) plane. The pressure generating chamber 12 is formed by etching the passage-forming substrate 10 until an etching depth (etched thickness) penetrates through the passage-forming substrate 10 and reaches the elastic film 50. Here, the elastic film 50 is eroded very little by the alkali solution used for etching the single crystal silicon substrate. Furthermore, each of the ink supply paths 14 communicating with one end of the corresponding one of the pressure generating chambers 12 is formed to be shallower than the pressure generating chamber 12 in the width direction of the passage-forming substrate 10, and the flow path resistance of the ink flowing into the pressure generating chamber 12 is kept to be constant. Specifically, the ink supply path 14 is formed by etching (half-etching) the single crystal silicon substrate partway in the thickness direction. Note that the half-etching is performed by regulating etching time.

A nozzle plate 20 is fixed to the opening plane of the passage-forming substrate 10 through adhesive, a heat-seal film or the like. A nozzle orifice 21 communicating with each pressure generating chamber 12 on the opposite side of the ink supply path 14 is perforated on the nozzle plate 20. Note that the nozzle plate 20 is made of glass ceramic, non-corrodible steel or the like, which has a thickness of, for example, 0.1 mm to 1 mm, a linear expansion coefficient of, for example, $2.5 \times 10^{-6}/°$ C. to $4.5 \times 10^{-6}/°$ C. at a temperature of 300° C. or less. The nozzle plate 20 covers an entire plane of one side of the passage-forming substrate 10, and also performs a role as a reinforcement plate for protecting the single crystal silicon substrate from shock and external force. Furthermore, the nozzle plate 20 may be made of a material having approximately the same thermal expansion coefficient as that of the passage-forming substrate 10. In this case, since deformations of the passage-forming substrate 10 and the nozzle plate 20 due to heat are substantially the same, it is possible to easily joint them by using thermosetting adhesive or the like.

Here, the size of the pressure generating chamber 12 giving ink droplet ejection pressure to the ink and the size of the nozzle orifice 21 ejecting the ink droplet are optimized depending on the quantity of the ink droplets ejected, ejection speed and an ejection frequency. For example, when 360 ink droplets are recorded per inch, the nozzle orifice 21 must be formed precisely so as to have a diameter of several ten $\mu$m.

On the other hand, on the elastic film 50 opposite to the opening portion of the passage-forming substrate 10, laminated are a lower electrode film 60 having a thickness of, for example, about 0.2 $\mu$m, a piezoelectric layer 70 having a thickness of, for example, about 1 $\mu$m and an upper electrode film 80 having a thickness of, for example, about 0.1 $\mu$m by processes to be described later, and thus piezoelectric element 300 is constructed. Here, the piezoelectric element 300 means a portion including the lower electric film 60, the piezoelectric layer 70 and the upper electrode film 80. In general, one of the electrodes of the piezoelectric element 300 is used as a common electrode, and the other electrode and the piezoelectric layer 70 are patterned for each pressure generating chamber 12, thus constituting the piezoelectric element 300. In this embodiment, the portion which is constituted by the piezoelectric layer 70 and one of the patterned electrodes and causes piezoelectric strain by applications of voltages to the electrodes is called piezoelectric active portion 320. In this embodiment, the lower electrode film 60 is used as the common electrode of the piezoelectric element 300, and the upper electrode film 80 is used as a discrete electrode. However, the other electrode thereof may be used as the common electrode and the lower electrode film 60 may be used as the discrete electrode without any trouble for the sake of convenience of wiring and a driving circuit. In any case, the piezoelectric active portion is formed for each pressure generating chamber. Furthermore, in the embodiment, the piezoelectric element 300 and a vibration plate making a displacement owing to a drive of the piezoelectric element 300 is collectively referred to as a piezoelectric actuator.

In this embodiment, a lead electrode 90 is provided so as to extend from the vicinity of a longitudinal end of the upper electrode film 80 of the piezoelectric element 300 to a region facing the wall of the pressure generating chamber 12, and the tip portion of the lead electrode 90 is positioned at the outside of a joint member to be described later.

A reservoir forming plate 30 having a reservoir portion 31, which constitutes at least a part of the reservoir 100, is jointed to each portion corresponding to communication portions on the piezoelectric elements 300 side of the passage-forming substrate 10. The reservoir portion 31 is formed so as to penetrate through the reservoir forming plate 30 in its thickness direction and so as to extend in the width direction of the pressure generating chamber 12. The reservoir 100 serving as a common ink chamber shared by each pressure generating chamber 12 is constituted so as to communicate with the communication portion 13 of the passage-forming substrate 10 through a through hole 51 formed in the elastic film 50, as described above.

A material having approximately the same thermal expansion coefficient as that of a passage-forming substrate such as glass, ceramic material and the like should be preferably employed as the reservoir forming plate 30. In this embodiment, the reservoir forming plate 30 was formed by use of the single crystal silicon substrate that is the same material used for the formation of the passage-forming substrate 10. Thus, both can be jointed to each other without fail even when both are jointed by use of thermosetting adhesive at a high temperature, similar to the case for the foregoing nozzle plate 20.

Figure 2:
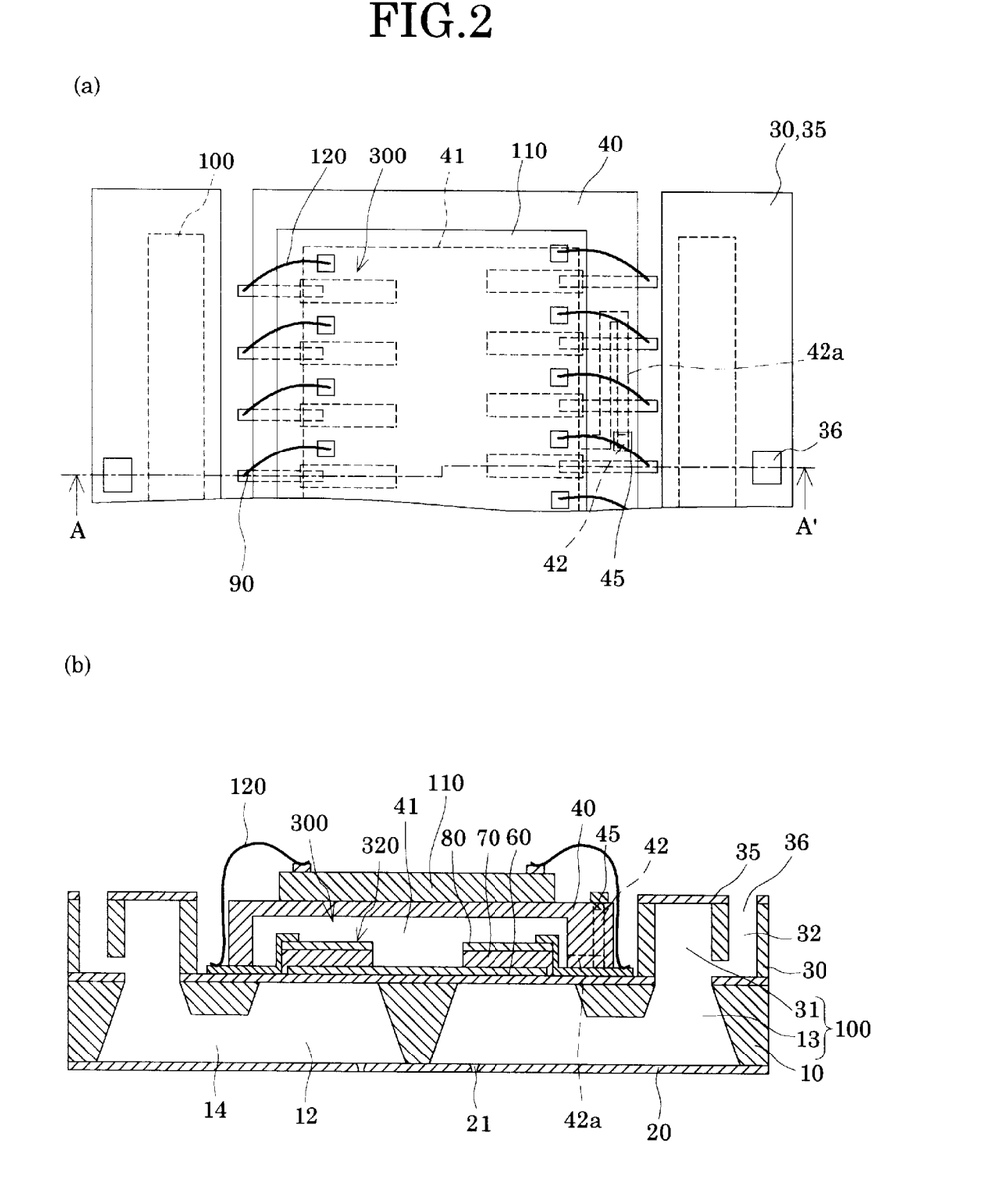
FIG. 2(a) is a plan view showing the ink-jet recording head according to the first embodiment of the present invention.
FIG. 2(b) is a section view showing the ink-jet recording head according to the first embodiment of the present invention.

Furthermore, a seal plate 35 made of metal such as stainless steel (SUS) is jointed to the reservoir forming plate 30, so as to seal the reservoir 100. An ink introduction port 36 for supplying ink to the reservoir 100 is formed in a portion of the seal plate 35 positioned outside the almost center of the reservoir 100 in its longitudinal direction (see FIG. 2). Furthermore, an ink introduction path 32 which allows the ink introducing port 36 and the side wall of the reservoir 100 to communicate with each other is provided in the reservoir forming plate 30.

Figure 3:
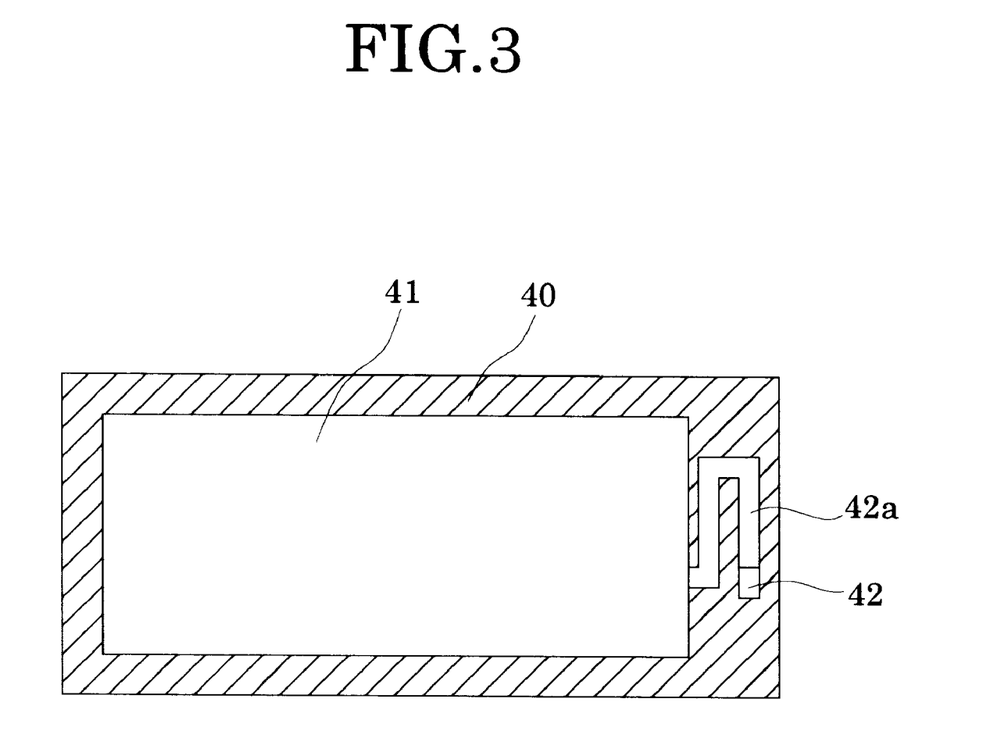
FIG. 3 is a view showing a rear surface of a joint member according to the first embodiment of the present invention.

A joint member 40, having a piezoelectric element holding portion 41 securing a space having a volume so as not to disturb movement of said piezoelectric element, is jointed to a region of the passage-forming substrate 10 corresponding to the piezoelectric element 300. Furthermore, the communication hole 42 allowing the piezoelectric element holding portion 41 to communicate with the outside is provided in the joint member 40, and a part of the communicating hole 42 is constituted by a groove portion 42a in this embodiment. The groove portion 42a is provided on the joint plane side of the joint member 40 with the passage-forming substrate 10, as shown in FIG. 3, and has a depth of about 10 $\mu$m and a width of about 100 $\mu$m, for example.

A drive circuit 110, such as a circuit board or a semiconductor integrated circuit (IC) having a drive circuit, for driving the piezoelectric element 300 is loaded on the joint member 40 and electrically connected to the tip of the lead electrode 90 provided so as to extend from the piezoelectric element 300 through a drive wiring 120 formed of a bonding wire.

A dry fluid such as inert gas is filled in the piezoelectric element holding portion 41 of the joint member 40 through the communication hole 42, and the communication hole 42 is sealed by a sealing member 45 made of resin. Moreover, the inside of the piezoelectric element holding portion 41 is hermetically sealed with air pressure lower than the atmospheric pressure, to be described in detail later. Thus, the piezoelectric element 300 is surely hermetically sealed in the dry fluid atmosphere in the piezoelectric element holding portion 41 and hence isolated from external environments.

As the dry fluid, reduced gas can be employed as well as inert gas. On the contrary, by permitting the dry fluid to contain oxidized gas, it is possible to create environments to prevent the piezoelectric layer from being deteriorated. Moreover, when such inert gas is employed, water vapor pressure (partial pressure) in the inert gas should be made as low as possible.

Next, procedures for filling up the piezoelectric element holding portion 41 with the dry fluid will be described.

Figure 4:
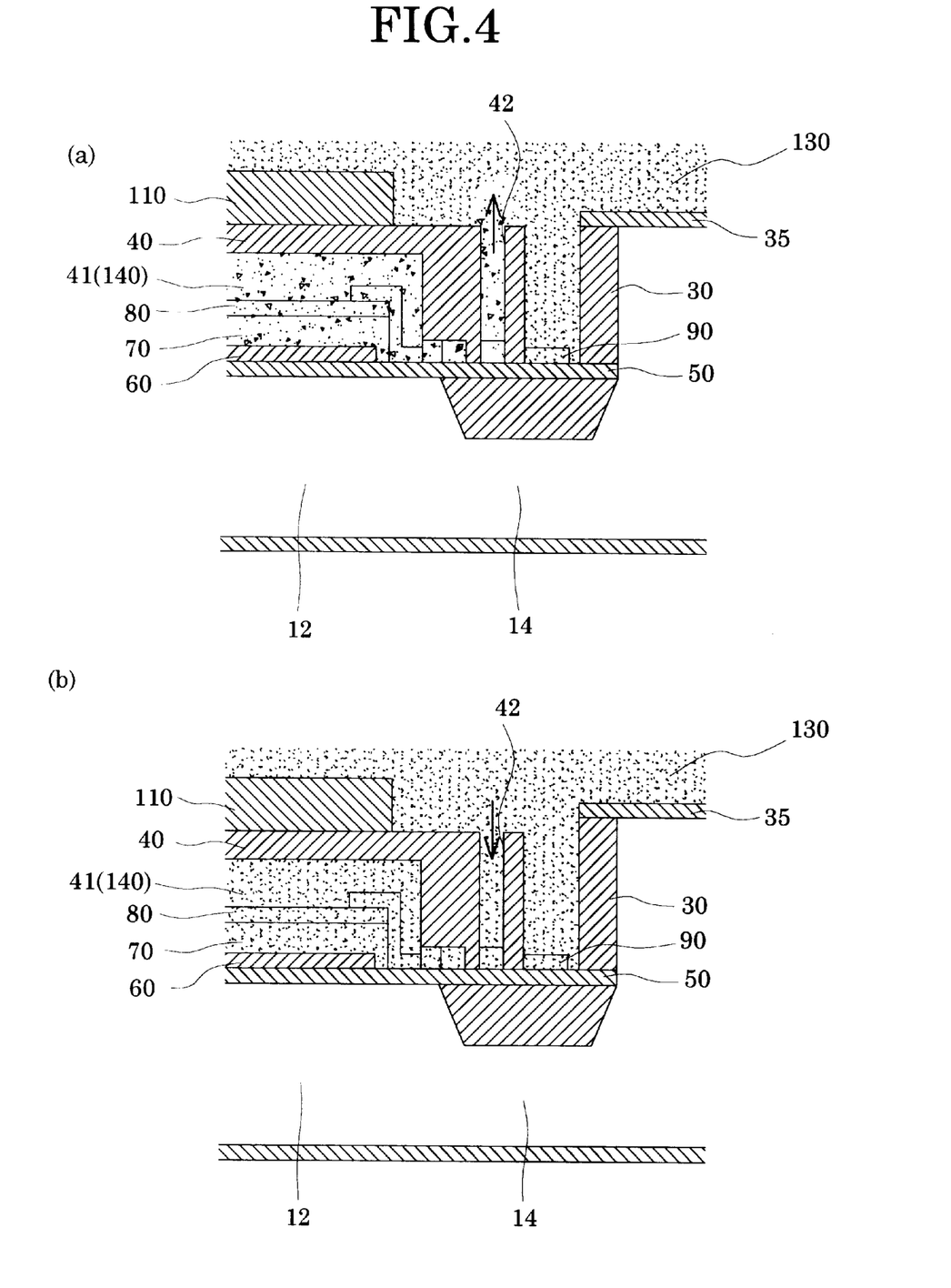

First, the ink-jet recording head is disposed within a sealed space filled with a specified dry fluid 130, and the space is decompressed. At this time, the piezoelectric element holding portion 41 is also decompressed, and the air 140 within the piezoelectric element holding portion 41 is exhausted to the outside through the communication hole 42, as shown in FIG. 4(a). Subsequently, the dry fluid 130 is introduced into the sealed space, and the air pressure in the sealed space is restored to normal pressure. Thus, as shown in FIG. 4(b), the dry fluid 130 flows into the piezoelectric element holding portion 41 through the communication hole 42 and fills therein. Specifically, the air 140 in the piezoelectric element holding portion 41 is replaced with the dry fluid 130.

Figure 5:
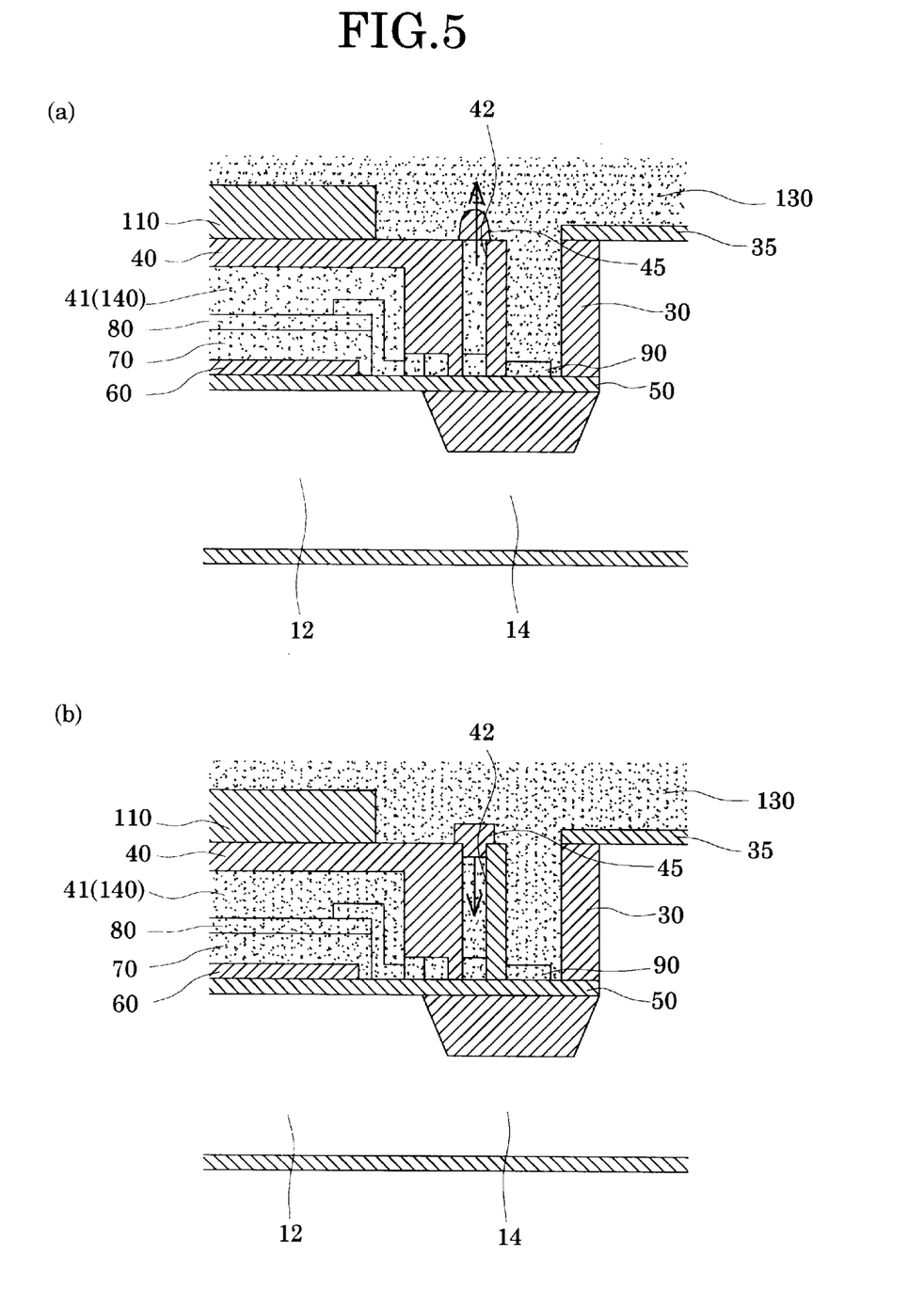

Subsequently, as shown in FIG. 5(a), uncured resin having a lowered viscosity by dissolution using, for example, volatile solvent is dropped into the communication hole 42, and the sealed space is decompressed again a little. The uncured resin serves as the sealing member 45. At this time, the dry fluid 130 in the piezoelectric element holding portion 41 is partially exhausted to the outside through a fine hole existing in the sealing member (uncured resin) 45, and the piezoelectric element holding portion 41 is also decompressed. Next, by restoring the pressure in the sealed space to the normal pressure, as shown in FIG. 5(b), the sealing member (uncured resin) 45 is partially pulled into the communication hole 42. Then, by allowing the volatile solvent to volatilize in this state, the sealing member (uncured resin) 45 is cured, and the communication hole 42 can be sealed up in a state where the dry fluid 130 is filled in the piezoelectric element holding portion 41. In addition, since air pressure in the piezoelectric element holding portion 41 is made to be lower than the atmospheric pressure, a state where the sealing member 45 is normally pulled into the communication hole 42 is maintained. Thus, the piezoelectric element holding portion 41 can be hermetically sealed up without fail.

Note that the quantity of the sealing member (uncured resin) 45 pulled into the communication hole 42 is determined depending on the size of the communication hole 42, length of the communication hole 42 (groove portion 42a), viscosity of the sealing member (uncured resin) and the like, and these may be decided appropriately. For example, in this embodiment, the groove portion 42a having approximately a "U" shape is provided so as to extend along the end face of the joint member 40. To be specific, the groove portion 42a meanders on a joint plane in a direction to connect the piezoelectric element holding portion 41 and the communication hole 42 for allowing the piezoelectric element holding portion to communicate with the outside. Accordingly, the flow path resistance is made relatively high by making the length of the groove portion 42a large, and the sealing member (uncured resin) 45 is not pulled into the piezoelectric element holding portion 41 (see FIG. 3).

The total length of the communication hole 42 should be longer than at least a value representing a length of the sealing member (uncured resin) 45 pulled into the communication hole 42. In other words, the total length x of the communication hole 42 should satisfy the relation expressed by the following equation (1) represented by the flow path resistance R per unit length of the communication hole 42, the injection pressure P of the sealing member 45 into the communication hole 42, the orifice area S of the communication hole 42 and the time t for which the sealing member 45 is pulled into, that is, the time t for which the sealing member is cured.

$$x > \frac{\sqrt{2 \times P \times t}}{\sqrt{R \times S}} \quad (1)$$

Furthermore, when a section shape of the communication hole 42 is approximately a circle having a radius a, assuming that the viscosity of the sealing member (uncured resin) 45 be $\mu$, the flow path resistance R of the communication hole 42 is expressed by the following equation (2).

$$R = \frac{8\mu}{\pi a^4} \quad (2)$$

In addition, when the section shape of the communication hole 42 is approximately a rectangle having a long side 2a and a short side 2b, the flow path resistance R is expressed by the following equation (3).

$$R = \frac{3\mu}{4ab^3 \left\{ 1 - \frac{192b}{\pi^5 a} \left( \tanh\frac{\pi a}{2b} + \frac{1}{3^5}\tanh\frac{3\pi a}{2b} + \Lambda \right) \right\}} \quad (3)$$

To be specific, the flow path resistance R of the communication hole 42 is determined by the viscosity $\mu$ of the sealing member 45, and the total length x of the communication hole 42 is appropriately determined in accordance with the viscosity and the curing rate of the uncured resin and length of the time t for which the sealing member 45 is pulled into, as shown in the above equation (1). Accordingly, if the length x of the communication hole 42 is set to a value satisfying the relation of the above equation (1) in consideration of properties of the resin serving as the sealing member, it is possible to surely prevent the sealing member 45 from entering the piezoelectric element holding portion 41. Note that, as described above, the time t for which the sealing member 45 is pulled is actually a time from the cancellation of the decompression state of the piezoelectric element holding portion 41 to the restoration to the normal pressure.

Figure 6:
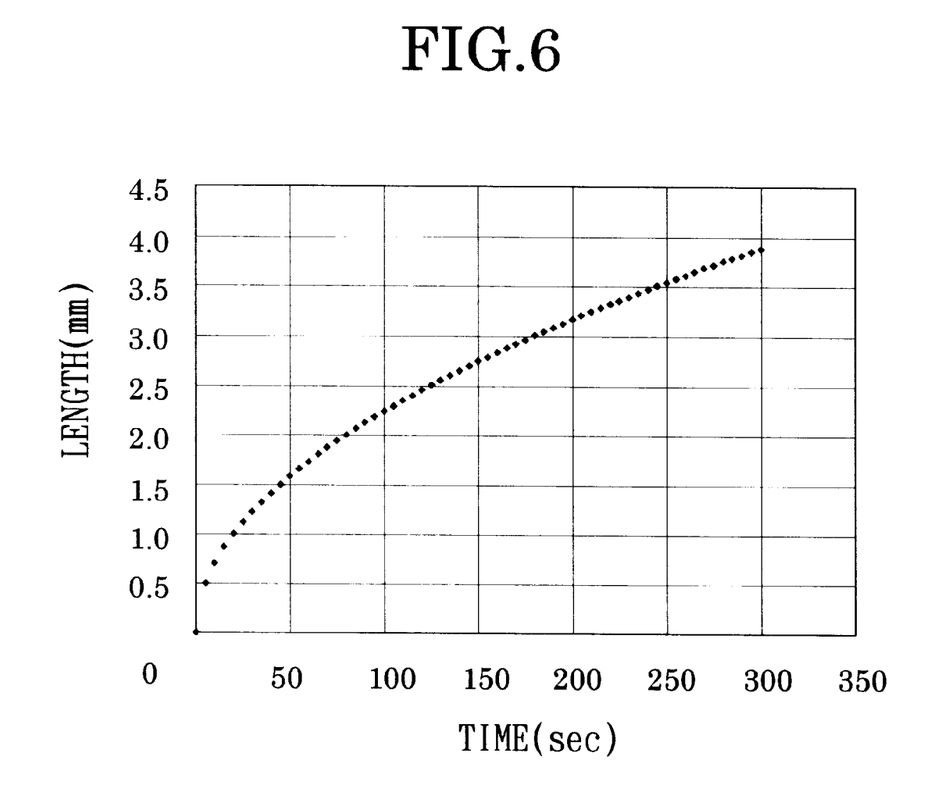
FIG. 6 is a graph showing the relation between the time for which a seal member is pulled into a communication hole and length.

For example, the graph shown in FIG. 6 shows the relationship between the time of the sealing member 45 to be pulled into the communication hole 42 and the length of the sealing member 45 pulled into the communication hole 42, assuming that the section shape of the communication hole 42 is approximately a rectangle having a long side of 50 $\mu$m and a short side of 25 $\mu$m and the viscosity of the sealing member 45 is 140 (P·s). As is understood from the graph, if the time t for which the sealing member 45 is pulled into the communication hole 42 is about 300 sec, the sealing member 45 is pulled into the communication hole 42 by about 3.9 mm. Since the viscosity of the sealing member 45 increases gradually, the length of the sealing member 45 pulled into the communication hole 42 is practically shorter than 3.9 mm. Based on these facts, if the total length of the communication hole 42 is set to about 4 mm, the sealing member 45 never enters the piezoelectric element holding portion 41, and the length of the communication hole 42 can be shortened relatively.

Figure 7:
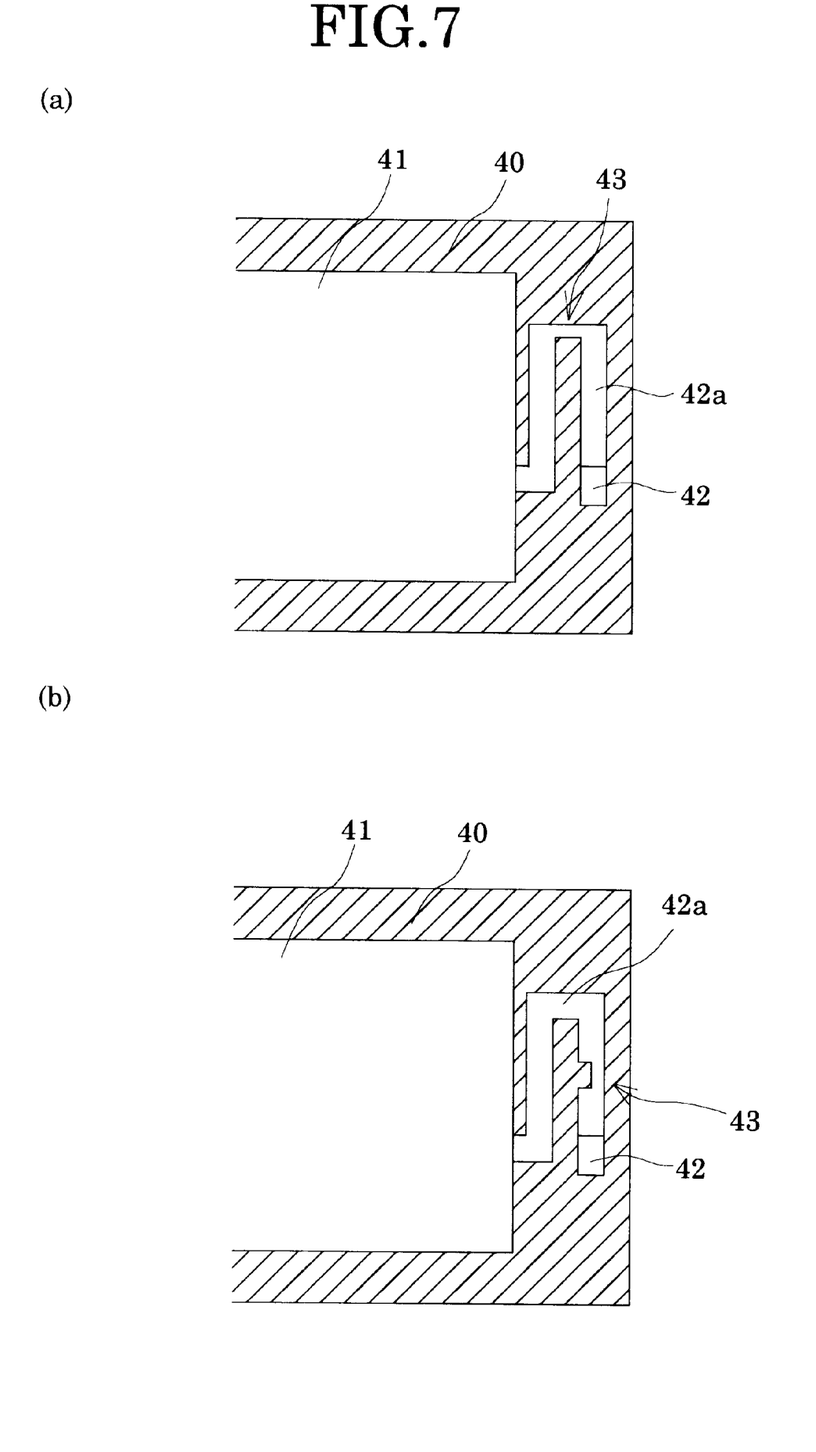
FIGS. 7(a) and 7(b) are plan views showing a modification of the ink-jet recording head according to the first embodiment of the present invention.

In this embodiment, the entrance of the sealing member 45 into the piezoelectric element holding portion 41 is prevented by adjusting the length of the communication hole 42. As shown in FIG. 7 the entrance of the sealing member 45 is also prevented, for example, by providing a resistance portion 43 in a part of the communication hole 42, which has a cross section narrower than other portions of the communication hole 42 and shows a large flow path resistance. With such a structure, the length of the sealing member 45 pulled into the communication hole 42 becomes shorter, and hence the entrance of the sealing member 45 into the piezoelectric element holding portion 41 can be surely prevented without fail.

According to a calculation, the resistance portion 43 should be preferably provided at a position of the communication hole 42 where the sealing member 45 enters there. Thus, the sealing member 45 never enters the piezoelectric element holding portion 41, and hence the entrance of the sealing member 45 surely stops within the communication hole 42.

In the constitution of this embodiment described above, since the piezoelectric element 300 is sealed in the piezoelectric element holding portion 41 filled with the dry fluid 130, it is possible to prevent operational malfunctions due to external environments around the piezoelectric element 300. Moreover, in this embodiment, the communication hole 42 communicating with the piezoelectric element holding portion 41 is sealed by using the sealing member (uncured resin) 45, so that the piezoelectric element holding portion 41 can be comparatively easily and surely sealed.

Note that as the sealing member 45, thermoplastic resin, thermosetting resin and the like can be enumerated in addition to resin containing a volatile solvent.

Embodiment 2

Figure 8:
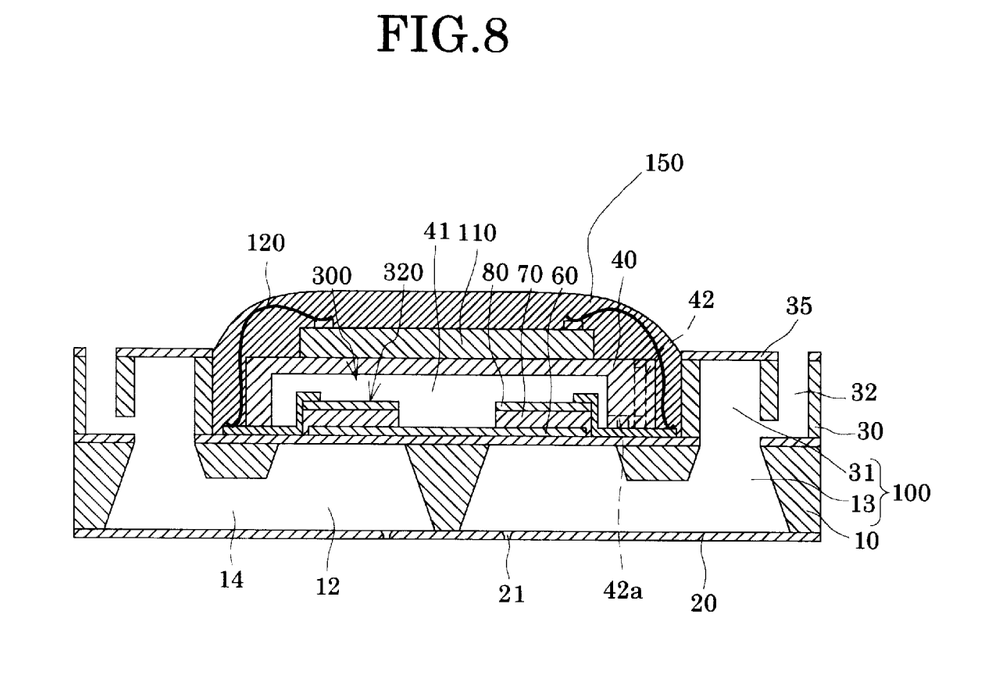
FIG. 8 is a section view showing an ink-jet recording head according to the second embodiment of the present invention.

FIG. 8 is a section view showing an ink-jet recording head according to an embodiment 2.

As shown FIG. 8, in this embodiment, a drive circuit 110 for driving a piezoelectric element 300 and a drive wiring 120 connected to the drive circuit 110 are covered by a mold member 150 made of resin to be protected, and a communication hole 42 is sealed by the mold member 150. Specifically, the embodiment 2 is identical to the embodiment 1 except that the mold member 150 for protecting the drive circuit 110 and the drive wiring 120 also performs a role as a sealing member for sealing the communication hole 42.

Because the mold member 150 covers the drive circuit 110 and the drive wiring 120 so as to improve environment-proof property and vibration-proof property of the drive circuit 110 and the drive wiring 120, the mold member 150 should cover in a situation that the mold member 150 is tightly adhered to the drive circuit 110 and the drive wiring 120 so that bubbles do not mix therein.

Although the method of forming the mold member 150 is not limited particularly, the mold member 150 should be manufactured by the following method.

The mold member 150 in an uncured state is dropped at a desired position first. Subsequently, the entirety of the parts is disposed within a predetermined sealed space, and the sealed space is decompressed. At this time, bubbles mixing into the uncured mold member 150 expand, and the bubbles are excluded from the mold member 150. At the same time, the mold member 150 is tightly adhered to the drive circuit 110 and the drive wiring 120. Thereafter, the air pressure in the sealed space is restored to atmospheric pressure, and the mold member 150 is cured under normal temperature or by heating.

By forming the mold member 150 according to such a method, bubbles never mix into the mold member 150, and hence a cover with a high reliability can be realized.

Furthermore, in this embodiment, since the communication hole 42 is sealed by the mold member 150, the uncured mold member 150 flows into the groove portion 42a through the communication hole 42 during the restoration of the pressure of the sealed space to the atmospheric pressure. At this time, the groove portion 42a is formed in a predetermined dimension as shown in FIGS. 3 and 7. Accordingly, the entering speed of the mold member 150 is remarkably lowered on the way in the groove portion 42a, and the piezoelectric element holding portion 41 is surely sealed without entrance of the mold member 150 into the piezoelectric element holding portion 41.

As described above, in this embodiment, the drive circuit 110 and the drive wiring 120 can be covered by the mold member 150, and, at the same time, the piezoelectric element holding portion 41 can be sealed. Therefore, it is possible to simplify the manufacturing steps.

As a matter of course, with such a constitution, breakdown due to the external environments around the piezoelectric element 300 can be prevented, similar to the embodiment 1.

Another Embodiment

The embodiments of the present invention were described as above. However, the fundamental structure of the ink-jet recording head is not limited to the ones described above.

In the foregoing embodiments, for example, the dry fluid is filled in the piezoelectric element holding portion 41. However, air may exist in the piezoelectric element holding portion 41 without filling the piezoelectric element holding portion 41 with the dry fluid.

In the foregoing embodiments, for example, the communication hole 42 allowing the piezoelectric element holding portion 41 to communicate with the outside is provided. However, the number of the communication holes 42 is not limited to one, but it is natural that a plural number of communication holes 42 may be provided.

In the foregoing embodiments, the ink-jet recording head of a thin film type, which is manufactured by applications of the film growth method and photolithography method, was described as the example. As a matter of course, the type of ink-jet recording head is not limited to this, and, for example, the present invention can be also adopted for an ink-jet recording head of a thick film type, which is formed by a method such as adhesion of a green sheet.

Figure 9:
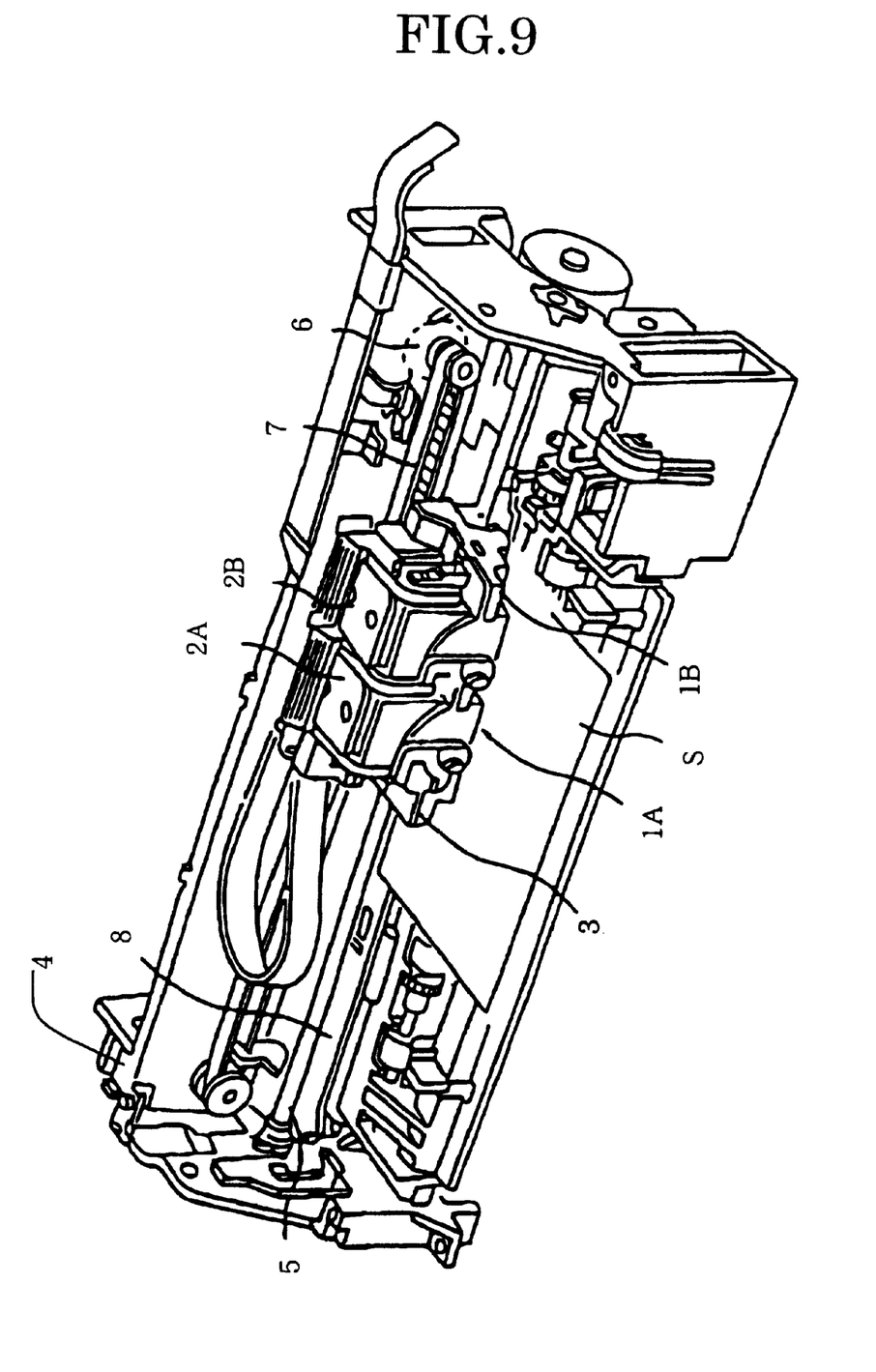
FIG. 9 is a schematic view of an ink-jet recording head according to an embodiment of the present invention.

Furthermore, the ink-jet recording heads embodied in these embodiments constitute a part of a recording heat unit comprising an ink flow path communicating with an ink cartridge and the like, and is loaded on an ink-jet recording apparatus. FIG. 9 is a schematic view showing an example of the ink-jet recording apparatus.

As shown in FIG. 9, in the recording head units 1A and 1B having the ink-jet recording heads respectively, cartridges 2A and 2B constituting ink supply means are detachably provided respectively, and a carriage 3 loading the recording head units 1A and 1B is provided so as to be movable along the shaft 5 fitted to the apparatus main body 4. For example, the recording head units 1A and 1B serve to eject black ink composition or color ink composition separately.

The driving force of drive motor 6 is transmitted to the carriage 3 through a plurality of gear wheels (not shown) and a timing belt 7, whereby the carriage 3 loading the recording head units 1A and 1B is allowed to move along the carriage shaft 5. On the other hand, a platen 8 is provided along the carriage shaft 5 in the apparatus main body 4, and a recording sheet S is wound around the platen 8 to be transported, which is a recording medium such as paper fed by a paper feeding roller (not shown) and the like.

As described above, according to the present invention, since the piezoelectric element is sealed in the piezoelectric element holding portion filled with the dry fluid, it is possible to prevent breakdowns owing to external environments around the piezoelectric element, particularly the piezoelectric layer. Furthermore, the communication hole communicating with the piezoelectric element holding portion is sealed by use of the uncured resin, so that the piezoelectric element holding portion can be sealed relatively easily and surely.

Although the preferred embodiments of the present invention have been described in detail, it should be understood that various changes, substitutions and alternations can be made therein without departing from the spirit and scope of the inventions as defined by the appended claims.

What is claimed is:

1. An ink-jet recording head which comprises a passage-forming substrate in which a pressure generating chamber communicating with a nozzle orifice is partitioned by a plurality of compartment walls; and a piezoelectric element provided on one plane side of the passage-forming substrate and causing a change in pressure in said pressure generating chamber, the ink-jet recording head comprising:
   a joint member jointed to a piezoelectric element side of said passage-forming substrate, said joint member having a piezoelectric element holding portion securing a space having a volume so as not to disturb movement of said piezoelectric element and at least one communication hole allowing said piezoelectric element holding portion to communicate with the outside,
   wherein a sealing member made of resin is filled in said communication hole, so that said piezoelectric element holding portion is hermetically sealed, and
   a total length x of said communication hole is a length satisfying a relation expressed by the following equation (1) represented by a flow path resistance R per unit length of said communication hole, an injection pressure P when said sealing member is injected into the communication hole, an orifice area S of said communication hole and a time t for which said sealing member is cured, wherein equation (1) is:

$$x > \frac{\sqrt{2 \times P \times t}}{\sqrt{R \times S}}. \tag{1}$$

2. The ink-jet recording head according to the claim 1, wherein said piezoelectric element holding portion is sealed under air pressure lower than atmospheric pressure.

3. The ink-jet recording head according to claim 2, wherein a part of said communication hole is constituted by a groove portion formed on a joint plane of said joint member and said passage-forming substrate.

4. The ink-jet recording head according to claim 3, wherein said communication hole meanders on a joint plane in a direction to connect said piezoelectric element holding portion and said communication hole for allowing the piezoelectric element holding portion to communicate with the outside.

5. The ink-jet recording head according to claim 1, wherein a resistance portion is provided in a part of said communication hole in a length direction thereof, the resistance portion showing a flow path resistance higher than that of other portions of said communication hole.

6. The ink-jet recording head according to claim 5, wherein said resistance portion has a cross section narrower than those of other portions of said communication hole.

7. The ink-jet recording head according to claim 5, wherein said resistance portion is provided at a position of said communication hole into which said sealing member enters.

8. The ink-jet recording head according to claim 1, wherein dry fluid is filled in said piezoelectric element holding portion.

9. The ink-jet recording head according to claim 8, wherein said dry fluid is inert gas.

10. The ink-jet recording head according to claim 8, wherein said dry fluid contains oxidized gas.

11. The ink-jet recording head according to claim 1, wherein a driving IC for driving said piezoelectric element is loaded on said joint member, and a protection member made of resin provided so as to cover said driving IC also performs a role as said sealing member.

12. The ink-jet recording head according to claim 1, wherein said pressure generating chamber is formed in a single crystal silicon substrate by anisotropic etching, and each layer forming said piezoelectric element is formed by a film growth method and a lithography method.

13. An ink-jet recording apparatus comprising;
   the ink-jet recording head according to any one of claims 1 to 12.

14. A method of manufacturing an ink-jet recording head which comprises:
   a passage-forming substrate in which a pressure generating chamber communicating with a nozzle orifice is partitioned by a plurality of compartment walls; and a piezoelectric element provided on one plane side of the passage-forming substrate and causing a change in pressure in said pressure generating chamber,
   the method comprising:
      a first step for adhering a piezoelectric side of said passage-forming substrate and joint member to each other, so that a joint body is formed; said joint member having a piezoelectric element holding portion securing a space having a volume on a piezoelectric element side of said passage-forming substrate so as not to disturb motion of the piezoelectric element and a communicating hole allowing the piezoelectric element holding portion to communicate with the outside;
      a second step for dropping uncured resin at least onto said communication hole of said joint member constituting said joint body;
      a third step for disposing said joint body in a predetermined sealed space and decompressing said sealed space; and
      a fourth step for restoring said sealed space to a normal pressure and curing said uncured resin.

15. The method of manufacturing an ink-jet recording head according to claim 14,
   the method further comprising:
      a replacing step for replacing the air in said piezoelectric element holding portion with dry fluid prior to said second step.

16. The method of manufacturing an ink-jet recording head according to claim 15, wherein said replacing step includes a step for disposing said joint body in a predetermined sealed space filled with said dry fluid and decompressing said sealed space; and a step for introducing said dry fluid into said sealed space and restoring said sealed space to a normal pressure.

17. The method of manufacturing an ink-jet recording head according to claim 14, wherein, in said second step, said uncured resin is provided so as to cover a drive circuit for driving said piezoelectric element provided on said joint member.

* * * * *